US009077313B2

(12) United States Patent
Cai et al.

(10) Patent No.: US 9,077,313 B2
(45) Date of Patent: Jul. 7, 2015

(54) LOW POWER AND LOW MEMORY SINGLE-PASS MULTI-DIMENSIONAL DIGITAL FILTERING

(75) Inventors: Mike M. Cai, Newark, CA (US); Huiming Zhang, Shanghai (CN)

(73) Assignee: VIVANTE CORPORATION, Santa Clara, CA (US)

( * ) Notice: Subject to any disclaimer, the term of this patent is extended or adjusted under 35 U.S.C. 154(b) by 932 days.

(21) Appl. No.: 13/274,129

(22) Filed: Oct. 14, 2011

(65) Prior Publication Data
US 2013/0097212 A1    Apr. 18, 2013

(51) Int. Cl.
G06F 17/15    (2006.01)
H03H 17/02    (2006.01)
G06F 17/10    (2006.01)

(52) U.S. Cl.
CPC ......... *H03H 17/0202* (2013.01); *G06F 17/153* (2013.01); *G06F 17/10* (2013.01); *H03H 2017/0245* (2013.01)

(58) Field of Classification Search
CPC .............................. G06F 17/153; G06F 17/16
USPC .......... 708/300–303, 308, 315; 345/545, 536, 345/619, 572, 547, 571
See application file for complete search history.

(56) References Cited

U.S. PATENT DOCUMENTS

| | | | | |
|---|---|---|---|---|
| 5,485,412 A * | 1/1996 | Sarkkinen et al. | ............ | 708/308 |
| 5,896,136 A * | 4/1999 | Augustine et al. | ............ | 345/605 |
| 6,801,674 B1 * | 10/2004 | Turney | ........................ | 382/298 |
| 7,636,497 B1 * | 12/2009 | Chambers | ...................... | 382/277 |
| 2003/0174244 A1 * | 9/2003 | Nakata | ........................... | 348/441 |
| 2005/0286792 A1 * | 12/2005 | Tadas et al. | .................... | 382/261 |
| 2010/0046851 A1 * | 2/2010 | Inoue et al. | .................... | 382/260 |
| 2011/0234636 A1 * | 9/2011 | Itkin et al. | ...................... | 345/649 |

OTHER PUBLICATIONS

V. Podlozhnyuk, "Image convolution with CUDA," NVIDIA Corporation white paper, vol. 2097, No. 3, 2007.*
R. Turney, "Two dimensional linear filtering," Xilinx Application Note XAPP933 (v1.1), 2007.*
Eldon, J., Stroll, Z., Swartzlander, E., "Image Processing Address Generator Chip", Proc. ICASSP, vol. 3. pp. 993-996, 1985.*

* cited by examiner

*Primary Examiner* — Chat Do
*Assistant Examiner* — Matthew Sandifer
(74) *Attorney, Agent, or Firm* — David R. Stevens; Stevens Law Group

(57) ABSTRACT

Disclosed are new approaches to Multi-dimensional filtering with a reduced number of memory reads and writes. In one embodiment, a filter includes first and second coefficients. A block of a data having width and height each equal to the number of one of the first or second coefficients is read from a memory device. Arrays of values from the block are filtering using the first filter coefficients and the results filtered using the second coefficients. The final result may be optionally blended with another data value and written to a memory device. Registers store results of filtering with the first coefficients. The block of data may be read from a location including a source coordinate. The final result of filtering may be written to a destination coordinate obtained by rotating and/or mirroring the source coordinate. The orientation of arrays filtered using the first coefficients varies according to a rotation mode.

12 Claims, 7 Drawing Sheets

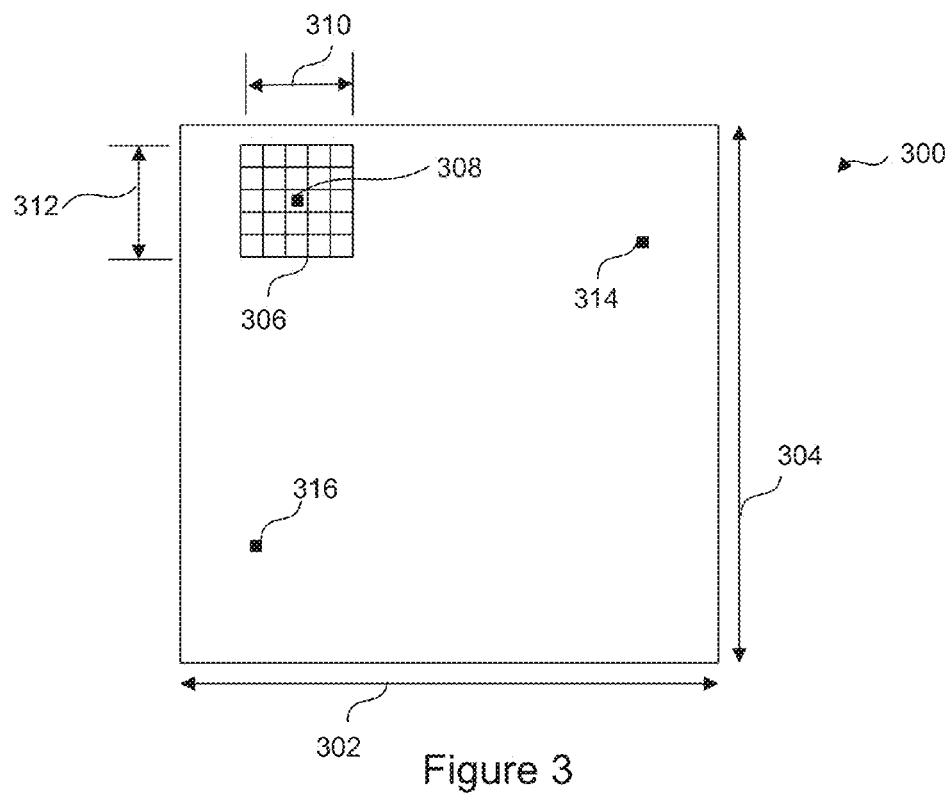
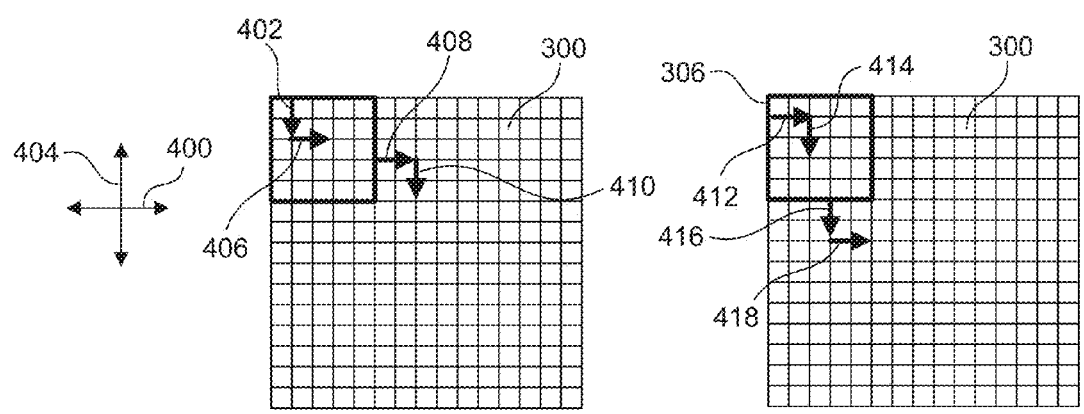
Figure 3
Figure 4A            Figure 4B

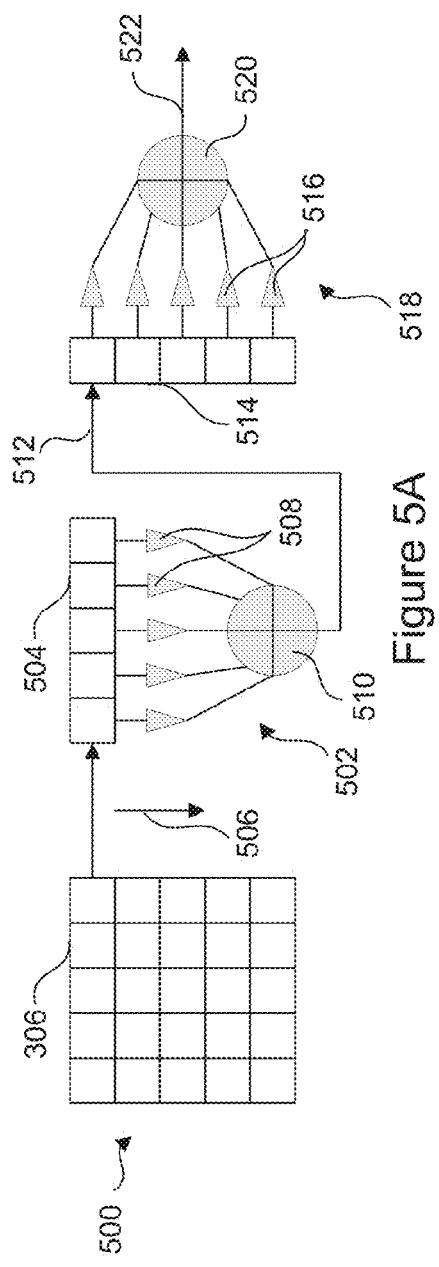
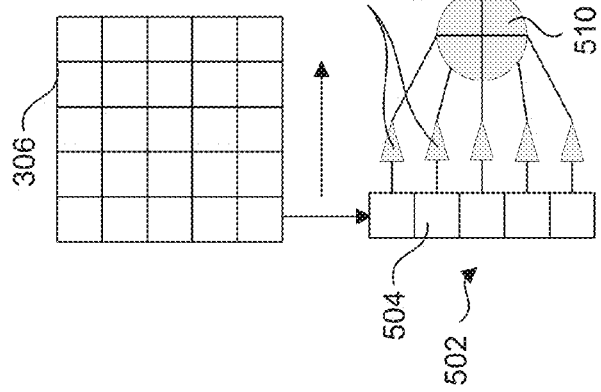
Figure 5A
Figure 5B

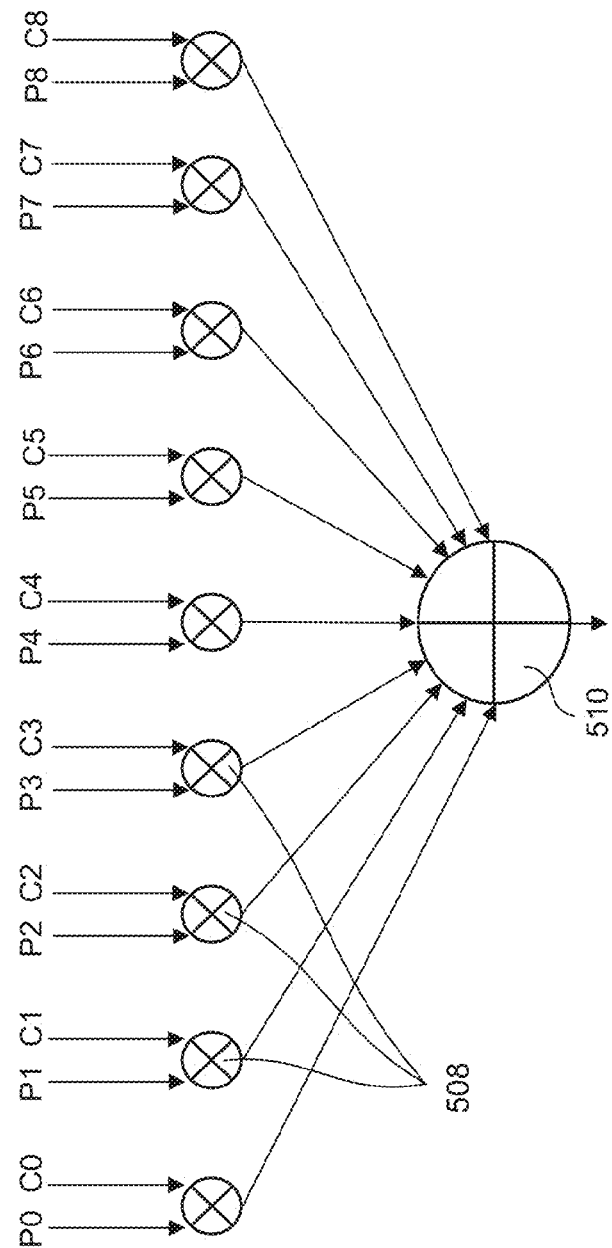

LOW POWER AND LOW MEMORY SINGLE-PASS MULTI-DIMENSIONAL DIGITAL FILTERING

BACKGROUND

The invention is related to methods and apparatus for performing digital filtering and convolution operations.

Filtering in the digital domain may be performed using a finite impulse response (FIR) filter defining a number of filter coefficients. The filter coefficients represent a unit impulse response function having a desired frequency response. Filtering is performed by convolving an input signal with the filter coefficients. Two dimensional arrays of input data can be filtering using a matrix of filter coefficients often referred to as a kernel.

Traditionally there are two methods to implement two dimensional separable filter and convolution. The first method involves multiple passes. The first pass performs filtering on arrays of data along one dimension and the second pass operates on arrays of data along a second dimension. This method is simple in implementation but it requires reading of the input data from memory twice and requires writing of the intermediate and final filtering results twice. In some applications, particularly computer graphics, the results of filtering may additionally be alpha blended with other input data, which requires reading of the other input data from memory and writing the output of alpha blending to memory.

These memory reads and writes are to off-chip memory such as DDR or SDRAM, which have high latency relative to the speed of a processor. The multiple memory reads and writes increase the memory bandwidth requirements, increase power consumption, and decrease performance of the overall system.

The second method involves only a single pass. This method reads multiple lines oriented in one dimension into line buffers in on-chip storage. Filtering is then performed on the lines stored in the buffers. For a 1920×1080 screen resolution, a 5×5 filter kernel, and 4 bytes per pixel, this method requires 37.5 kB of on-chip memory. The line buffer size increases with vertical filter kernel size. For 9×9 filter kernel, the line buffer needs to be 67.5 Kbytes. Such a large on-chip memory is expensive and consumes a large amount of power. For low power applications, e.g., embedded systems, larger on-chip memory is therefore not acceptable In view of the foregoing, what is needed is a two-dimensional filtering apparatus and method that has drastically reduced power and memory requirements.

DESCRIPTION OF THE DRAWINGS

The specific features, aspects and advantages of the present invention will become better understood with regard to the following description and accompanying drawings where:

FIG. 3 is a diagram of a source data block illustrating a source matrix and transformed destination coordinates in accordance with an embodiment of the present invention.

FIGS. 4A and 4B are diagrams illustrating a non-rotating source matrix progression in accordance with an embodiment of the present invention.

FIG. 5A. is a schematic block diagram of a filter configured in a non-rotating mode in accordance with an embodiment of the present invention.

FIG. 5B. is a schematic block diagram of a filter configured in a rotating mode in accordance with an embodiment of the present invention.

FIG. 6. is a schematic block diagram of a filter stage suitable for use in accordance with an embodiment of the present invention.

DETAILED DESCRIPTION

Figure 1:
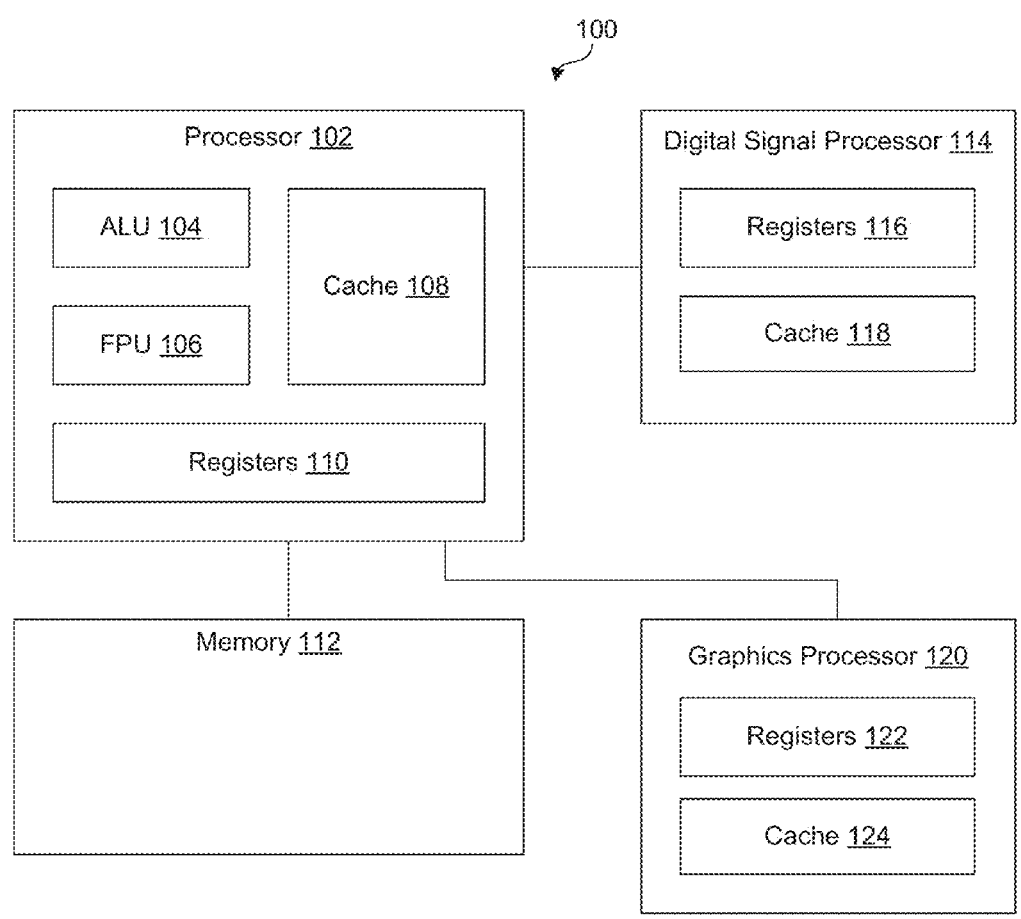
FIG. 1 is a schematic block diagram of an operating environment suitable for use in accordance with an embodiment of the present invention.

In the following description of the invention, reference is made to the accompanying drawings, which form a part hereof, and in which is shown by way of illustration specific embodiments in which the invention is may be practiced. It is understood that other embodiments may be utilized and structural changes may be made without departing from the scope of the present invention.

The invention is directed to a novel approach to low power and low memory single-pass multi-dimensional digital filtering, with various embodiments and examples for illustration. In one embodiment a method for processing digital data includes providing a first filter having a first number of coefficients and a second filter having a second number of coefficients. Each digital value in a contiguous region of a matrix of digital values stored in a first memory device is processed by reading a block of digital values containing the digital value from the first memory device. The block of digital values has a width equal to one of the first number of coefficients and the second number of coefficients. The block of coefficients may have a height equal to the other of the first number of coefficients and the second number of coefficients. Filtering using the first filter is performed on arrays of digital values within the block of digital values, the arrays being oriented in a same orientation direction. An array of results of filtering the arrays of digital values is then filtered using the second filter. An output of the second filter is then written to one of the first memory device and a second memory device.

In another embodiment, an output of the second filter is blended with a digital value stored at a location and a result of the blending is written to the location. The location may be in the first memory device or the second memory device.

In another embodiment, a rotation mode is selected. The arrays of digital values are oriented in a first direction in a first rotation mode and oriented in a second direction in the second rotation mode.

In another embodiment, each digital value has a corresponding source coordinate within the first memory device and writing the result of filtering the array of results includes rotating the source coordinate according to the selected rotation mode to obtain a destination coordinate. In some embodiments, the source coordinate is also mirrored to obtain the destination coordinate.

In another embodiment, the results of filtering the arrays of digital values are stored in a third memory device, the third memory device having a faster access time than the first memory device. The third memory device may include a plurality of registers.

The filtering approaches described herein provide a unique apparatus and method for performing multi-dimensional filtering with a reduced number of memory reads and writes.

Other advantages of the disclosed filtering methods and apparatus will become apparent from the detailed description which follows hereinafter when taken in conjunction with the accompanying drawing figures.

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning networks, interfaces, computing systems, and the like have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, digital components, or analog components or a combination thereof, unless indicated otherwise. Certain terms are used throughout the following description and Claims to refer to particular system components. As one skilled in the art will appreciate, components may be referred to by different names. This document does not intend to distinguish between components that differ in name, but not function. In the following discussion and in the claims, the terms "including" and "comprising" are used in an open-ended fashion, and thus should be interpreted to mean "including, but not limited to . . . "

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 1 illustrates an exemplary operating environment 100 suitable for use with embodiments described herein. The operating environment 100 may include a general purpose processor 102 operable to execute executable data and operate on operational data. The processor 102 may include an arithmetic and logic unit (ALU) 104 for performing logical operations and fixed point arithmetic operations. The processor 102 may further include a floating point unit (FPU) 106 for performing floating point arithmetic operations. The ALU 104 and FPU 106 may be formed on the same chip as the processor 102 or may be otherwise operably coupled to the processor 102.

The processor 102 may further include an on-chip cache 108 and one or more registers 110. The registers 110 may serve to maintain the state of the processor and store intermediate results. As known in the art the on-chip cache 108 may have lower latency than a memory 112, such as RAM, DDR, SDRAM, or the like that may be operably coupled to the processor 102. The registers 110 may provide lower latency than the cache 108 and memory 112.

The processor 102 may also be operably coupled to a digital signal processor (DSP) 114. As known in the art a DSP 114 may be operable to perform analog-to-digital and digital-to-analog conversion, digital filtering, and other digital signal processing operations known in the art. The DSP 114 may include its own data registers 116 for storing intermediate results and maintaining the state of the DSP 114. The DSP 114 may also include its own data cache 118 for reducing latency of data reads and writes. As for the processor 102, the registers 116 may have lower latency than the cache 118 and the cache 118 may have lower latency than the memory 112.

In many computer systems, digital arithmetic operations common to computer graphics are performed by a dedicated graphics processor 120. The graphics processor 120 may likewise perform filtering operations on image and other data. The graphics processor may perform operations such as scaling images, performing coordinate transformations, and other operations required to process digital image and video data. The graphics processor 120 may include its own data registers 122 for storing intermediate results and maintaining the state of the graphics processor 120. The graphics processor 120 may also include its own data cache 124 for reducing latency of data reads and writes. As for the processor 102, the registers 122 may have lower latency than the cache 124 and the cache 124 may have lower latency than the memory 112.

Figure 2:
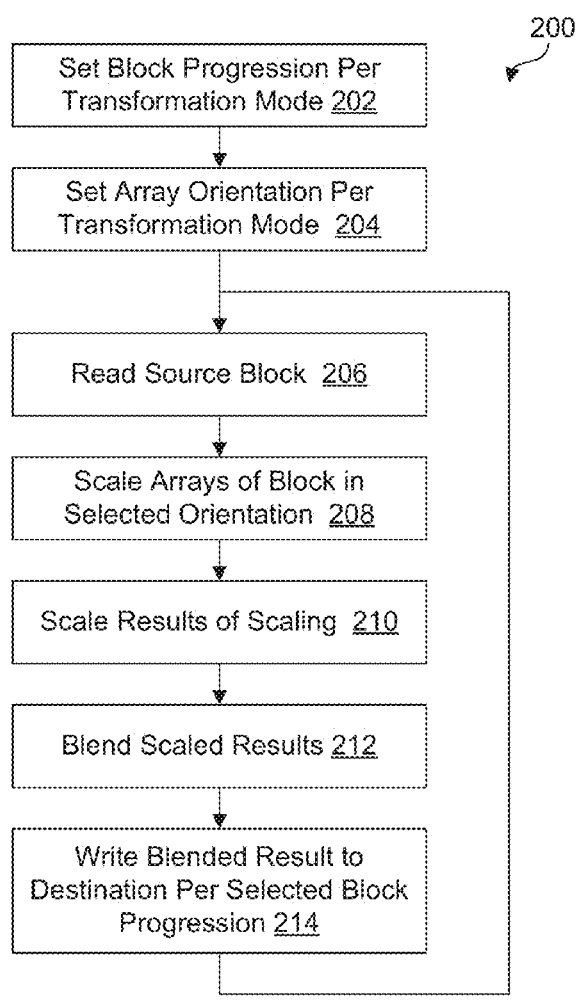
FIG. 2 is a process flow diagram of a method for performing two-dimensional filtering in accordance with an embodiment of the present invention.

Referring to FIG. 2, a processor 102, DSP 114, graphics processor 120, or other device, may perform a method 200 for performing two-dimensional filtering may include setting 202 a block progression according to a transformation mode and setting 204 an array orientation according to a transformation mode. A source matrix of data values is then read 206 from a memory device, such as a memory or cache. The data read at step 206 may be stored in a memory device having lower latency. For example, data read from a memory, such as a type of RAM, may be stored in an on-chip cache or in registers. Data read from an on-chip cache may be stored in registers. Arrays of the source matrix having the orientation set at step 204 may then be scaled 208 using first filter coefficients. The results of the scaling may then be scaled 210 using second coefficients, which may be different from, or identical to, the first coefficients. Scaling 208, 210 may include multiplying the values within an array by filter coefficients and summing the results of the multiplications. The scaled results may be alpha blended 212 with another data value and then written 214 to a destination coordinate according to the selected block progression.

Referring to FIG. 3, while still referring to FIG. 2, the source matrix may be read 206 from a data block 300 that is much larger than the source matrix. The data block 300 has a width 302 and height 304, measured in terms of data values. The source matrix 306 is defined by a source coordinate 308 and a block having a width 310 and height 312 containing the source coordinate. The width 310 and height 312 may be equal or unequal. The width 310 and height 312 may be equal to the number of filter coefficients in one or both of the first filter coefficients and the second filter coefficients used to perform the scaling steps 208, 210.

In some embodiments, the source coordinate 308 is not chosen to be data values on the edge of the data block 300.

Each filter has a number of coefficients used to multiply arrays of values, including values on either side of the source coordinate 308. For data values at the edge of the data block 300, the data values to at least one side of the source coordinate are not defined. For example, if a filter has five coefficients in both the horizontal and vertical directions than a band of two data values along each edge of the data block 300 may not be selected as the source coordinate 308.

Setting 202 the block progression according to a transformation mode determines where a result of processing each source matrix 306 will be written. Where no rotation or mirroring is desired, the source coordinate 308 may be the same as the destination coordinate. Where the results of the method 200 are written 214 to a separate block of addresses, the destination coordinate may be the same as the source coordinate relative to a base address of the destination data block.

Where rotation or mirroring is desired, a destination coordinate 314 may be different from the source coordinate 308 relative to a base address of the destination coordinate 314. For example, destination coordinate 314 corresponds to a 90 degree rotation of the source coordinate and destination coordinate 316 corresponds to a 270 degree rotation.

The block progression determines how the next source coordinate 308 is selected based on the previous source coordinate 308 or destination coordinate 314, 316. Implementing a selected block progression may be accomplished in multiple ways. For example, in one embodiment, the source coordinate 308 is selected according to a fixed progression independent of the transformation mode, e.g., left to right and top to bottom. The destination coordinate is then selected by transformation of the source coordinate 308 according to a transformation mode to a transformed destination coordinate, e.g., destination coordinate 314, 316. In an alternative embodiment, a selected block progression is accomplished by selecting a destination coordinate according to a fixed progression, e.g., left to right and top to bottom, and transforming the destination coordinate according to a transformation mode to determine the corresponding source coordinate.

For a given source coordinate (x,y) the transformation mode determines the destination coordinate (x', y'). The equations for a 90 degree rotation are given by (1) and (2), where W is the width and height of the original data block 300.

$$x'=W-y-1 \qquad (1)$$

$$y'=x \qquad (2)$$

The equations for a 180 degree rotation are given by (3) and (4).

$$x'=W-x-1 \qquad (3)$$

$$y'=W-y-1 \qquad (4)$$

The equations for a 270 degree rotation are given by (5) and (6).

$$x'=y \qquad (5)$$

$$y'=W-x-1 \qquad (6)$$

The equations for a horizontal mirroring transformation are given by (7) and (8), where R and L are the horizontal location of the right and left edges, respectively, of the data block 300.

$$x'=R+L-x \qquad (7)$$

$$y'=y \qquad (8)$$

The equations for a vertical mirroring transformation are given by (9) and (10), where T and B are the vertical location of the top and bottom edges, respectively, of the data block 300.

$$x'=x \qquad (9)$$

$$y'=T+B-y \qquad (10)$$

In some embodiments, rotation according to the pairs of equations (1)-(6) may be performed prior to mirroring according to the pairs of equations (7)-(10). Alternatively, the order may be reversed such that mirroring is performed prior to rotation.

Referring to FIG. 4A, while still referring to FIG. 2, for a transformation mode that requires no rotation or a 180 degree rotation, the array orientation and block progression may be as illustrated. Within the source matrix, arrays are oriented in a horizontal direction 400 and the scaling 208 of the arrays progresses in direction 402 parallel to a vertical direction 404. The scaling 210 of results of the scaling 208 progresses in direction 406 parallel to the horizontal direction 400. The destination coordinate for each block may progress along lines in direction 408 parallel to the horizontal direction 406 and then in direction 410 parallel to the vertical direction 404 to the next line. The progression of the destination coordinate in FIG. 4A may correspond to a source coordinate progression along each line parallel to the horizontal direction 400 and then progressing in vertical direction 404 to the next line.

Referring to FIG. 4B, while still referring to FIG. 2, for a transformation mode that requires 90 or 270 degree rotation, the array orientation and block progression may be as illustrated. Within the source matrix 306, arrays are oriented in the vertical direction 404 and the scaling 208 of individual arrays progresses in direction 412 parallel to the horizontal direction 400. The scaling 210 of results of the scaling 208 progresses in direction 414 parallel to the vertical direction 404. The destination coordinate for each block may progress along each line in direction 416 parallel to the vertical direction 404 and then in direction 418 parallel to the horizontal direction 400 to the next line. The progression of the destination coordinate in FIG. 4B may likewise correspond to a source coordinate progression along each line parallel to the horizontal direction 406 and then progressing in vertical direction 404 to the next line.

Referring to FIG. 5A, while still referring to FIG. 2, the scaling steps 208, 210 may be accomplished by the illustrated two-stage filter 500. The first filter stage 502 receives arrays 504 from the source matrix 306. The illustrated filter is for a non-rotating configuration such that the arrays 504 are oriented in the horizontal direction 400 and the arrays are processed in a progression direction 506 parallel to the vertical direction 404. The values of each element in an array 504 are input to multipliers 508 and the outputs of the multipliers 508 are input to a summer 510, which produces an output 512. The output 512 corresponding to each array 504 of the source matrix is stored in an intermediate result array 514, which may be embodied as registers of a processor 102, DSP 114, or graphics processor 120. Once a sufficient number of intermediate results have accumulated in the intermediate result array 514, the values from the intermediate result array 514 are input to multipliers 516 of a second filter stage 518. The outputs of the multipliers 516 are input to a summer 520 to produce an output 522.

Referring to FIG. 5B, for rotating modes, e.g., 90 and 270 degree rotations, the first and second filter stages may be configured as illustrated. As is apparent, the arrays 504 are oriented parallel to the vertical direction 404 and the arrays 504 are processed according to a progression direction 506 oriented parallel to the vertical direction 410. The arrays 504 are input to multipliers 508 and are processed as described with respect to FIG. 5A. The filters configurations of FIGS. 5A and 5B may readily be modified for use in three- or higher-dimensional arrays by adding another filter stage after the second filter stage 518, registers for accumulating results of the second filter stage 518.

Referring to FIG. 6, the multipliers 508 take as inputs the values of each array 504 (P0, P1, P2, . . . ) and coefficient values (C0, C1, C2, . . . ). The configuration of the multipliers 516 may be identical except the values P0, P1, P2, etc., will be replaced with the intermediate result array 514 and the values of the coefficients C0, C1, C2, etc., may also be different for each filter stage 502, 518. The values of the coefficients input to the multipliers 508, 516 may be not change for each array 504, 514 processed. Alternatively, the coefficients may include a number of phases such that the coefficients used vary as the source matrix 306 progresses across the data block 300.

In some embodiments, the number of multipliers 508 is greater than the number of coefficients needed. In such embodiments, the values of some of the coefficients may be zero. For example, in FIG. 6, where only five coefficients are needed, C0, C1, C7, and C8 may all be equal to zero. and only values P3-P7 may correspond to values from the source matrix 306.

Figure 7:
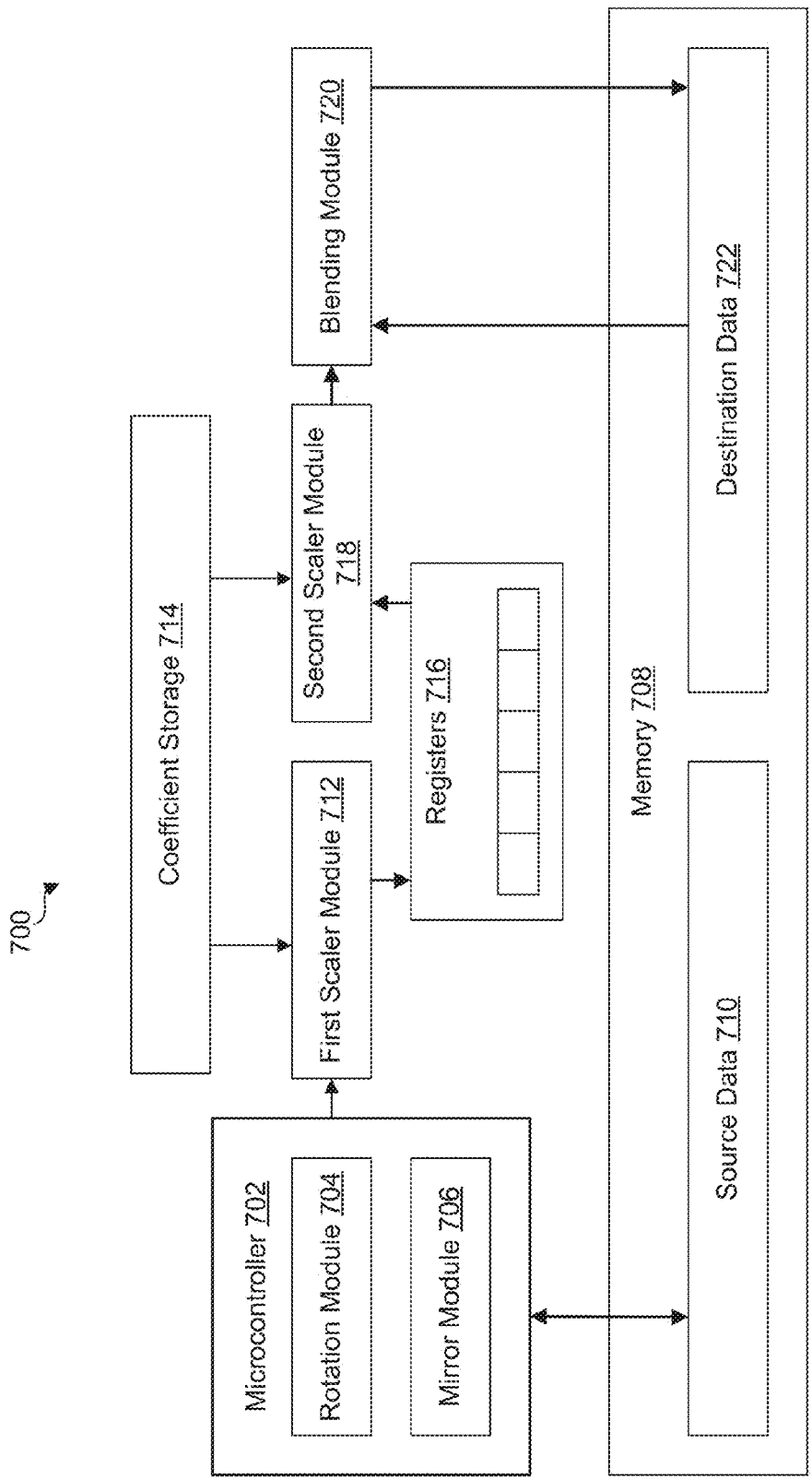
FIG. 7. is a schematic block diagram of a filter in accordance with an embodiment of the present invention.

Referring to FIG. 7, a filter 700 may be used to implement the foregoing methods. The filter 700 may be implemented by a processor 102, DSP 114, or graphics processor 120. The filter 700 may be implemented as software modules having the recited functions or by specific circuits implementing each module. Each module may represent a specific device or software module or a set of instructions or circuits within a software or hardware module performing the recited function.

The filter 700 may include a microcontroller 702 for controlling the filtering performed by the filter 700. The micro controller 702 may include a rotation module 704 and a mirror module 706. The rotation module 704 may select a source coordinate, destination coordinate, or both according to a rotation mode. The rotation module 704 may further select arrays from a source matrix 306 associated with a selected source coordinate having the proper orientation for a given rotation mode. The mirror module 706 may take as an input a source coordinate, destination coordinate, or both, and output a mirrored source or destination coordinate according to a mirror mode. The mirror module 706 may take as an input a coordinate output by the rotation module 704 or may provide an output that is rotated by the rotation module 704.

In some embodiments, the source coordinate is selected by the microcontroller 700 in a fixed manner, e.g., progressing from right to left and from top to bottom of the data block 300. The rotation module 704 and mirror module 706 then operate on the source coordinate to select a destination coordinate having the proper mirroring and rotation.

The microcontroller 702 may be coupled to a memory 708 that may be embodied as an on-chip cache or a type of off-chip RAM. The microcontroller 702 reads a source matrix 308 from source data 710 stored in the memory 708. The source matrix 308 includes the source coordinate. The microcontroller 702 may serially output arrays from the source matrix having an oriented corresponding to a selected rotation mode, as described above with respect to FIGS. 4A-5B. Alternatively, the microcontroller 702 may output addresses for the arrays or an element within each array.

The arrays, or array address, output from the microcontroller 702 may be received by a first scaler module 712. The first scaler module 712 multiplies each element of the input array by coefficients and sums the results of the multiplications. The coefficients for the first scaler module may be read from coefficient storage 714 that may be embodied as registers, on-chip cache, or a type of off-chip RAM. The coefficients 714 may be the same for each array or may vary cyclically with each array, e.g., have multiple phases.

The output of the first scaler module 712 is stored in registers 716. The number of registers 716 is preferably at least as large as the number of coefficients of a second scaler module 718. Outputs of the first scaler module 712 for each array in a source matrix are stored in the registers 716. The second scaler module 718 multiplies each output of the first scaler module 712 by a coefficient and sums the results of the multiplications. The second scaler module 718 may be configured to wait until each array has been filtered using the first scaler module 712 prior to scaling the outputs.

The output of the second scaler module 718 may be input to a blending module 720. The blending module 720 reads a value located at the destination coordinate determined by the microcontroller 702 from destination data 722. The destination data 722 may be stored in the same memory 708 or a different memory device. The blending module 720 combines the destination data with the output of the second scaler module 718 according and writes the result to the destination coordinate. The blending performed by the blending module 720 may be alpha blending or any other blending operation known in the art.

The destination data 722 defines a data block with a destination width ($W_D$) and height ($H_D$). As noted previously, the original data block 300 likewise defines a source width ($W_S$) and height ($H_S$). In some embodiments, the filtering operation scales one or both of the destination width $W_D$ and height $H_D$ relative to the source width $W_S$ and height $H_S$. Accordingly a horizontal scale ratio $R_H$ and a vertical scale ratio $R_V$ may be defined such that $R_H=W_S/W_D$ and $R_V=H_S/H_D$.

In some applications $W_S$ is fixed. For example, in some graphics contexts, $W_S$ is limited to 64 pixels in a 16 bit per pixel (BPP) mode and 32 pixels in 32 BPP mode. $H_S$ may be a function of $H_D$ and $R_V$ such that $H_S=H_D*R_V$. In some applications $W_D$ is constant. In some graphics contexts, $W_D$ is 64 pixels in 16 BPP mode and 32 pixels in 32 BPP mode.

In some applications, the number of source cache lines and destination cache lines should be less than or equal to 64. Accordingly (11) and (12) may be used to derive (13), which gives $H_D$ in terms of the vertical scale ratio $R_V$.

$$W_D \times H_D + W_S \times H_S \leq 64 \tag{11}$$

$$H_D + 2 \times H_D \times R_V \leq 64 \tag{12}$$

$$H_D = \mathrm{floor}(64/(1+2 \times R_V)) \tag{13}$$

In some applications (11)-(13) apply specifically to non-rotation or 180 degree rotation modes.

For 90 degree and 270 degree rotation modes, $W_S$ and $H_S$ may be related to $W_D$ and $H_D$ differently. A cache may include N lines and N may be equal to $W_S$. The total number of pixels may be given by 16N−2 for 16 pixels per line or 32N−2 for 32 pixels per line. The "−2" term is included since edge pixels are not processed. $H_S$ may be equal to the number of coefficients of the filter, e.g., the first scaler module 712. In many applications three or five coefficients are used. $H_D$ may be a constant value equal to the number of pixels in one destination cache line, e.g., 16 in 32 BPP mode and 32 in 16 BPP mode.

In some embodiments, the constraint of (14) applies to $W_S$, $H_S$, $W_D$, and $H_D$.

$$W_S \times H_S + W_D \times H_D \leq 64 \qquad (14)$$

Given the above described definition for $R_H$ and given $W_S=N$, (15) is obtained from (14).

$$(16 \times N - 2)/R_H \leq 64 \qquad (15)$$

Manipulation of (15) yields (16) and (17) for a 32 BPP mode.

$$\text{floor}[(64 \times R_H + 2)/(16 + 5 \times R_H)] \leq 64 \qquad (16)$$

$$H_D = \text{floor}[(16 \times N - 2)/R_H] \leq 64 \qquad (17)$$

For a 16 BPP mode, the corresponding equations are (18) and (19).

$$\text{floor}[(64 \times R_H + 2)/(32 + 5 \times R_H)] \leq 64 \qquad (18)$$

$$H_D = \text{floor}[(32 \times N - 2)/R_H] \leq 64 \qquad (19)$$

Figure 8:
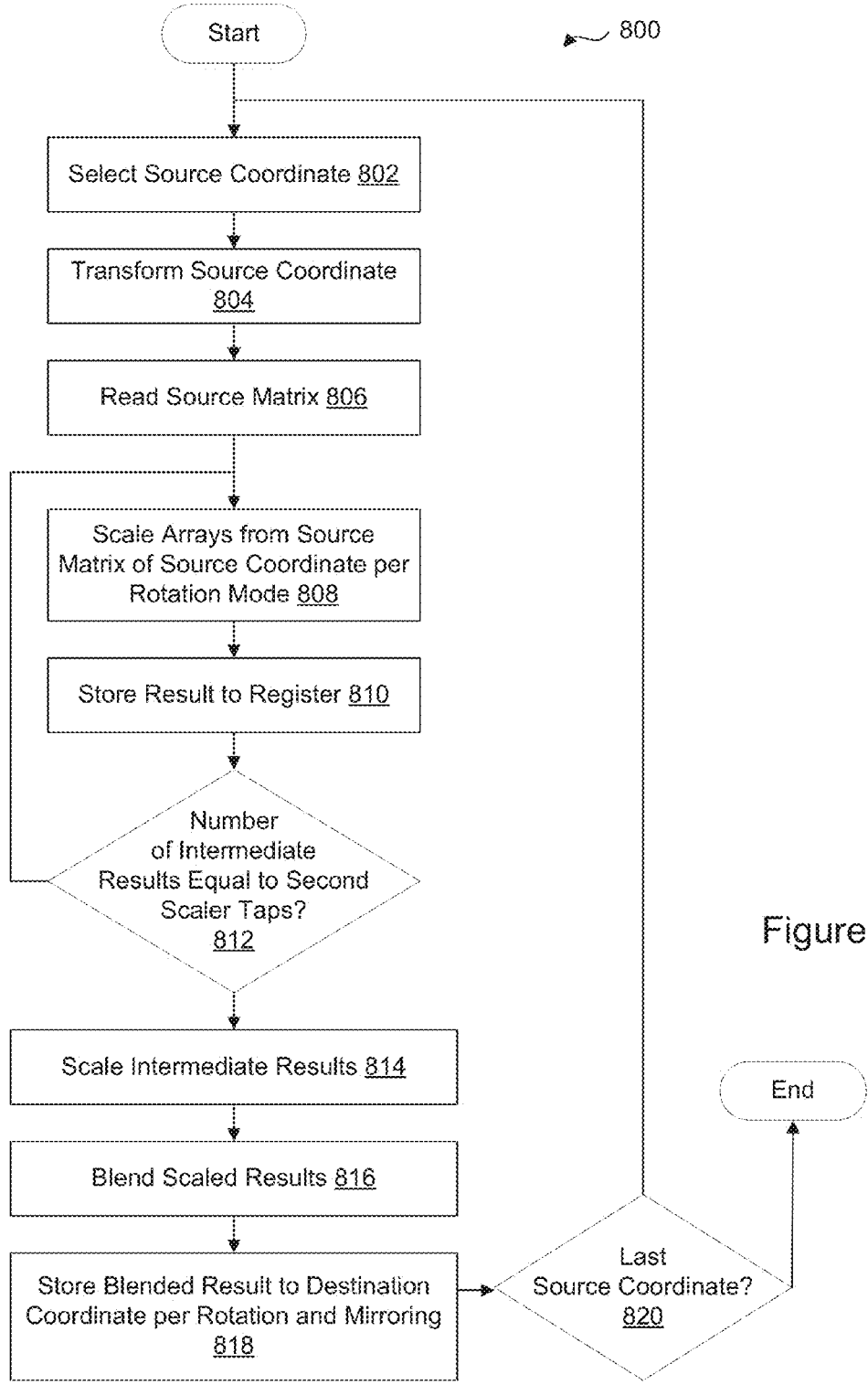
FIG. 8. is a process flow diagram of a method for performing filtering in accordance with an embodiment of the present invention.

Referring to FIG. 8, a method 800 for performing two-dimensional filtering may include selecting 802 a source coordinate. Selecting 802 may include selecting the source coordinate according to a fixed progression, e.g., from left to right and top to bottom, of a source data block. Alternatively, selecting 802 may include transforming a destination coordinate selected according to a fixed progression, the transformation being according to a rotation and/or mirroring mode. The selected source coordinate may then be transformed 804, such as by rotating and/or mirroring the source coordinate according to a rotation mode and mirroring mode, respectively. The order of rotation and mirroring may be reversed and either one or both may be omitted in some embodiments. In embodiments where the destination coordinate is selected according to a fixed progression, the transformation 804 may be performed on the current destination coordinate rather than the source coordinate and the result of the transformation used as the selected source coordinate. In such embodiments, selecting 802 the source coordinate may be replaced by selecting 802 a destination coordinate.

A source matrix including a data values surrounding and/or including a data value stored at the source coordinate is then read 806 from a first memory device, such as type of off-chip RAM or an on-chip cache. Arrays of values from the source matrix are then scaled 808. Scaling 808 may include multiplying each of the values of the array by a coefficient and summing the result of the multiplications. As described hereinabove above, the orientation of the arrays, e.g., horizontal or vertical, may be chosen according to a rotation mode. A result of each scaling step 808 is stored 810 in a register. As soon as the number of intermediate results stored in the registers is found 812 to be equal to the number of "taps" or coefficients of a second scaling stage, the intermediate results are then scaled 814. A counter may be used to determine 812 when a sufficient number of intermediate results have been accumulated. The result of the second scaling 814 may be blended 816 with a data value stored at a destination coordinate determined by transformation 804 of the source coordinate or by a selected 802 destination coordinate that was transformed 804 to determine the source coordinate. The result of the blending 816 may then be written 818 to the destination coordinate. If the selected source coordinate or destination coordinate is found 820 to be the last coordinate in a source data block, then the method 800 may end. Finding 820 whether a last coordinate has been reached may be accomplished by means of a counter or by a program or circuit operable to perform a proper number of iterations to process the source coordinates that are to be processed. In some embodiments, source coordinates along the edge of a source data block are not processed and are not considered in a determination of whether all source coordinates have been processed. Otherwise, another source coordinate or destination coordinate is selected 802 and the method 800 repeats.

The above described apparatus and methods provide significant advantages over the prior art. As an example, a filter with five taps and 32 phases with coefficients represented as 16 bit fixed point numbers includes 5×5×32 coefficients. In some implementations, this may require as many as 12.8 thousand gates. In contrast, the single-pass approach described herein may advantageously only use (5+5)×32 coefficients, a reduction of 50 percent. In addition, the number of memory reads and writes is reduced. Data values of a source matrix are read from a high-latency memory only once and intermediate results do not need to be written and then re-read from memory for filtering or blending. This reduces the bandwidth requirements of an on-chip cache or off-chip RAM device and corresponding power consumption.

As discussed herein, the invention may involve a number of functions to be performed by a computer processor, such as a microprocessor. The microprocessor may be a specialized or dedicated microprocessor that is configured to perform particular tasks according to the invention, by executing machine-readable software code that defines the particular tasks embodied by the invention. The microprocessor may also be configured to operate and communicate with other devices such as direct memory access modules, memory storage devices, Internet-related hardware, and other devices that relate to the transmission of data in accordance with the invention. The software code may be configured using software formats such as Java, C++, XML (Extensible Mark-up Language) and other languages that may be used to define functions that relate to operations of devices required to carry out the functional operations related to the invention. The code may be written in different forms and styles, many of which are known to those skilled in the art. Different code formats, code configurations, styles and forms of software programs and other means of configuring code to define the operations of a microprocessor in accordance with the invention will not depart from the spirit and scope of the invention.

Within the different types of devices, such as laptop or desktop computers, hand held devices with processors or processing logic, and also possibly computer servers or other devices that utilize the invention, there exist different types of memory devices for storing and retrieving information while performing functions according to the invention, this is used for transitive and non-transitive storage. Cache memory devices are often included in such computers for use by the central processing unit as a convenient storage location for information that is frequently stored and retrieved. Similarly, a persistent memory is also frequently used with such computers for maintaining information that is frequently retrieved by the central processing unit, but that is not often altered within the persistent memory, unlike the cache memory. Main memory is also usually included for storing and retrieving larger amounts of information such as data and software applications configured to perform functions according to the invention when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. During data storage and retrieval operations, these memory devices are transformed to have different states, such as different electrical charges, different magnetic polarity, and the like. Thus, systems and methods configured according to the invention as described herein enable the physical transformation of these memory devices. Accordingly, the invention as described herein is directed to novel and useful systems and methods that, in one or more embodiments, are able to transform the memory device into a different state during transitive and non-transitive storage. The invention is not limited to any particular type of memory device, or any commonly used protocol for storing and retrieving information to and from these memory devices, respectively.

Although the components and modules illustrated herein are shown and described in a particular arrangement, the arrangement of components and modules may be altered to process data in a different manner. In other embodiments, one or more additional components or modules may be added to the described systems, and one or more components or modules may be removed from the described systems. Alternate embodiments may combine two or more of the described components or modules into a single component or module.

Finally, although specific embodiments of the invention have been described and illustrated, the invention is not to be limited to the specific forms or arrangements of parts so described and illustrated. The scope of the invention is to be defined by the claims appended hereto, any future claims submitted here and in different applications, and their equivalents.

The foregoing description has been presented for the purposes of illustration and description. It is not intended to be exhaustive or to limit the invention to the precise form disclosed. Many modifications and variations are possible in light of the above teaching. Further, it should be noted that any or all of the aforementioned alternate embodiments may be used in any combination desired to form additional hybrid embodiments of the invention.

What is claimed is:

1. A method for processing digital data comprising:
   providing, in a processing device, a first filter having a first number of coefficients and a second filter having a second number of coefficients; and
   for each digital value in a contiguous region of a matrix of digital values stored in a first memory device:
      reading, by the processing device, a block of values containing the digital value from the first memory device, the block of values having a width equal to one of the first number of coefficients and the second number of coefficients and a height equal to the other of the first number of coefficients and the second number of coefficients;
      filtering, by the processing device, using the first filter, arrays of digital values within the block of values, the arrays oriented in an orientation direction;
      filtering, by the processing device, using the second filter, an array of results of filtering the arrays of digital values; and
      writing, by the processing device, a result of filtering the array of results to one of the first memory device and a second memory device;
   selecting, by the processing device, a rotation mode from a first and a second rotation mode;
   wherein the arrays of digital values are oriented in a first direction in the first rotation mode and oriented in a second direction in the second rotation mode, the first direction being perpendicular to the second direction;
   wherein each digital value has a corresponding source coordinate within the first memory device; and
   wherein writing the result of filtering the array of results further comprises:
      rotating, by the processing device, the source coordinate according to the selected rotation mode to obtain a destination coordinate; and
      writing, by the processing device, the result of filtering the array of results to the destination coordinate.

2. The method of claim 1, further comprising blending the result of filtering the array of results with a digital value stored at a location; and
   wherein writing the result of filtering the array of results comprises writing a result of the blending to the location.

3. The method of claim 1, further comprising:
   selecting a mirror mode; and
   rotating the source coordinate according to the selected mirror mode to obtain the destination coordinate.

4. The method of claim 1, further comprising storing the results of filtering the arrays of digital values in a third memory device, the third memory device having a faster access time than the first memory device.

5. The method of claim 4, wherein the third memory device comprises a plurality of registers.

6. The method of claim 1, wherein filtering using the first filter and filtering using the second filter both comprise scaling and summing operations.

7. The method of claim 1, wherein filtering using the first filter and filtering using the second filter are performed by one or more of:
   a fixed-point arithmetic unit;
   a floating point unit;
   a digital signal processor; and
   a graphics processor.

8. A method for processing digital data comprising:
   for each digital value in a logically contiguous region of a matrix of digital values stored in a first memory device:
      reading, by a processing device, a block of values containing the digital value from the first memory device;
      scaling, by the processing device, and summing a plurality of arrays of values from the block of values using first coefficients to obtain a plurality of intermediate results, the block of values having an extent in a first dimension equal to the number of first coefficients;
      storing, by the processing device, the plurality of intermediate results in a second memory device having a faster read/write time than the first memory device;
      scaling and summing, by the processing device, the plurality of intermediate results using second coefficients to obtain a final result, the second coefficients having a number equal to an extent in a second dimension of the block of values; and
      writing, by the processing device, the final result to one of the first memory device and a third memory device;
   selecting, by the processing device, a rotation mode from a first and second rotation mode;
   wherein the arrays of digital values are oriented in along the first dimension in the first rotation mode and oriented along the second dimension in the second rotation mode, the first dimension being perpendicular to the second dimension;
   wherein each digital value has a corresponding source coordinate within the first memory device; and
   wherein writing the final result comprises:
      selecting, by the processing device, a destination coordinate within one of the first and third memory devices, the destination coordinate selected by rotation of the source coordinate according to the selected rotation mode; and writing, by the processing device, the final result to the destination coordinate.

9. The method of claim 8, further comprising blending the final result with a digital value stored at a location in one of the first and third memory devices to obtain a blended result;
wherein writing the final result comprises writing the blended result to the location.

10. The method of claim 8, further comprising selecting a mirror mode;
wherein selecting the destination coordinate further comprises selecting the destination coordinate according to the selected mirror mode.

11. The method of claim 8, wherein the second memory device comprises a plurality of registers.

12. A processing device for processing digital the device programmed to:
receive a first filter having a first number of coefficients and a second filter having a second number of coefficients; and for each digital value in a contiguous region of a matrix of digital values stored in a first memory device coupled to the processing device:
read a block of values containing the digital value from the first memory device, the block of values having a width equal to one of the first number of coefficients and the second number of coefficients and a height equal to the other of the first number of coefficients and the second number of coefficients;

filter using the first filter, arrays of digital values within the block of values, the arrays oriented in an orientation direction;

filter using the second filter, an array of results of filtering the arrays of digital values; and write a result of filtering the array of results to one of the first memory device and a second memory device;

select a rotation mode from a first and a second rotation mode;

wherein the arrays of digital values are oriented in a first direction in the first rotation mode and oriented in a second direction in the second rotation mode, the first direction being perpendicular to the second direction;

wherein each digital value has a corresponding source coordinate within the first memory device; and wherein the processing device is programmed to write the result of filtering the array of results by:
rotating the source coordinate according to the selected rotation mode to obtain a destination coordinate; and writing the result of filtering the array of results to the destination coordinate.

* * * * *